United States Patent
Meschenmoser et al.

(10) Patent No.: US 9,956,575 B2
(45) Date of Patent: May 1, 2018

(54) TRANSPORT ARRANGEMENT FOR MANIPULATING LENSES

(71) Applicant: Carl Zeiss Vision GmbH, Aalen (DE)

(72) Inventors: Ralf Meschenmoser, Essingen (DE); Gerhard Weiss, Westhausen (DE); Martin Littek, Korb-Kleinheppach (DE); Andreas Dangelmaier, Aalen (DE)

(73) Assignee: Carl Zeiss Vision GmbH, Aalen (DE)

( * ) Notice: Subject to any disclaimer, the term of this patent is extended or adjusted under 35 U.S.C. 154(b) by 57 days.

(21) Appl. No.: 14/692,232

(22) Filed: Apr. 21, 2015

(65) Prior Publication Data

US 2015/0224531 A1    Aug. 13, 2015

Related U.S. Application Data

(63) Continuation of application No. 12/929,484, filed on Jan. 28, 2011, now Pat. No. 9,036,280, which is a
(Continued)

(30) Foreign Application Priority Data

Jan. 27, 2005   (DE) ........................ 10 2005 004 006

(51) Int. Cl.
*B05C 3/02* (2006.01)
*B05C 13/02* (2006.01)
(Continued)

(52) U.S. Cl.
CPC ............... *B05C 3/02* (2013.01); *B05C 13/02* (2013.01); *B23Q 3/084* (2013.01);
(Continued)

(58) Field of Classification Search
CPC ... B05C 13/02; B23Q 3/084; B29D 11/00432; B29D 11/00009; C03B 11/12; C23C 14/50; C23C 14/505; G02B 7/025
See application file for complete search history.

(56) References Cited

U.S. PATENT DOCUMENTS 2,260,471 A    10/1941   McLeod
4,315,046 A    2/1982    Frye
(Continued)

FOREIGN PATENT DOCUMENTS

CH          196011 A    2/1938
DE          235 924     5/1986
(Continued)

OTHER PUBLICATIONS

Machine translation of JP 07096239, retrieved electronically from Espacenet, Nov. 16, 2016.*
(Continued)

*Primary Examiner* — Cara Rakowski
(74) *Attorney, Agent, or Firm* — Walter Ottesen, P.A.

(57) ABSTRACT

A holding device (1) holds a lens (6) at its lens edge (5) with the aid of an adhesive connection (16, 17). The adhesive connection (16, 17) is applied only at one adhesive point or only at two spaced apart adhesive points (16, 17). Each holding device (1) provided with a lens (6) is positioned on the dip frame in such a manner that the lens (6) is positioned above its holding device (1). A method is provided for finishing lenses (6) wherein the lenses (6) are subjected to various sequential finishing steps of a finishing process and the lenses (6) are cemented to the same holding device during finishing. The application of adhesive is only at one adhesive point or at two spaced apart adhesive points (16, 17).

10 Claims, 12 Drawing Sheets

Related U.S. Application Data continuation of application No. 11/826,722, filed on Jul. 18, 2007, now Pat. No. 7,916,407, which is a continuation-in-part of application No. PCT/EP2006/000573, filed on Jan. 24, 2006.

(51) Int. Cl.

| | | |
|---|---|---|
| *C23C 14/50* | (2006.01) | |
| *B29D 11/00* | (2006.01) | |
| *B23Q 3/08* | (2006.01) | |
| *G02B 7/02* | (2006.01) | |
| *C03B 11/12* | (2006.01) | |

(52) U.S. Cl.
CPC .. *B29D 11/00009* (2013.01); *B29D 11/00432* (2013.01); *C03B 11/12* (2013.01); *C23C 14/50* (2013.01); *C23C 14/505* (2013.01); *G02B 7/025* (2013.01)

(56) References Cited

U.S. PATENT DOCUMENTS

| | | | |
|---|---|---|---|
| 5,026,469 | A | 6/1991 | Kunkel et al. |
| 5,124,019 | A | 6/1992 | Kunkel et al. |
| 5,451,281 | A | 9/1995 | Lipman |
| 5,913,653 | A | 6/1999 | Kempf |
| 5,938,902 | A | 8/1999 | Nguyen et al. |
| 6,024,444 | A | 2/2000 | Little |
| RE37,461 | E | 12/2001 | Izumitami |
| 6,894,849 | B2 | 5/2005 | Yamamoto et al. |
| 6,984,849 | B2 | 1/2006 | Nishizawa et al. |
| 7,074,119 | B2 | 7/2006 | Miyazawa et al. |
| 7,130,135 | B2 | 10/2006 | Shimizu |
| 7,510,724 | B2 | 3/2009 | Pensel |
| 7,575,210 | B2 | 8/2009 | Gehrig et al. |
| 7,602,679 | B2 | 10/2009 | Ohta et al. |
| 2002/0018306 | A1 | 2/2002 | Andoh et al. |
| 2002/0075916 | A1 | 6/2002 | Sato et al. |
| 2003/0231835 | A1 | 12/2003 | Do et al. |
| 2004/0222538 | A1 | 11/2004 | Weymouth, Jr. |
| 2005/0104240 | A1 | 5/2005 | Jethmalani et al. |
| 2005/0208212 | A1 | 9/2005 | Jallouli et al. |
| 2008/0038456 | A1 | 2/2008 | Lipson |

FOREIGN PATENT DOCUMENTS

| | | |
|---|---|---|
| DE | 43 14 595 A1 | 11/1994 |
| DE | 102 28 054 | 1/2004 |
| EP | 0 483 034 | 4/1992 |
| EP | 0 497 651 | 8/1992 |
| EP | 0 955 253 | 11/1999 |
| EP | 1 295 962 | 3/2003 |
| FR | 2 689 880 | 10/1993 |
| GB | 655856 | 8/1951 |
| JP | 60150001 A | 8/1985 |
| JP | 6-248451 | 9/1994 |
| JP | 07096239 A * | 4/1995 |

OTHER PUBLICATIONS

Translation of German Office Action dated Oct. 12, 2005.
Translation of German Office Action dated Nov. 2, 2006.
Translation of Chinese Office Action dated Sep. 11, 2009.
Translation of International Preliminary Report on Patentability dated Jul. 31, 2007.
Translation of second Chinese Office Action dated Dec. 1, 2010.
Office action of the German Patent Office dated Sep. 7, 2012 in German patent application 10 2005 004 006.3 on which the claim of priority is based and English translation thereof.
Chain—definition of Chain by the Free Online Dictionary, 2009, Houghton Mifflin Company.
Latch-definition of Latch by The Free Online Dictionary, 2003, Harper Collins Publishers.
Dictionary definition of "Point", Merriam Webster Dictionary, Accessed online at www.merriam-webster.com/dictionary/point, Mar. 28, 2013.

* cited by examiner

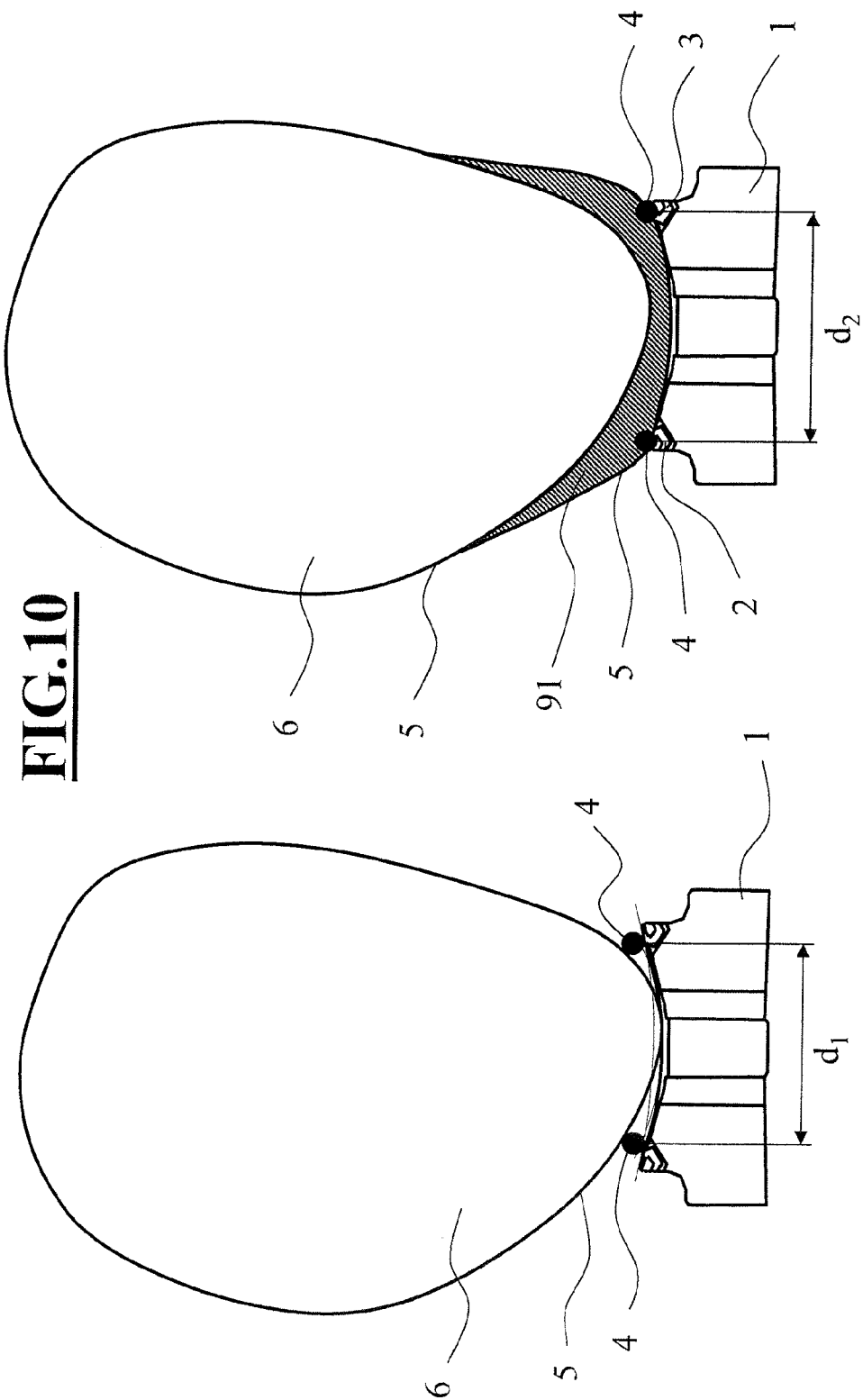

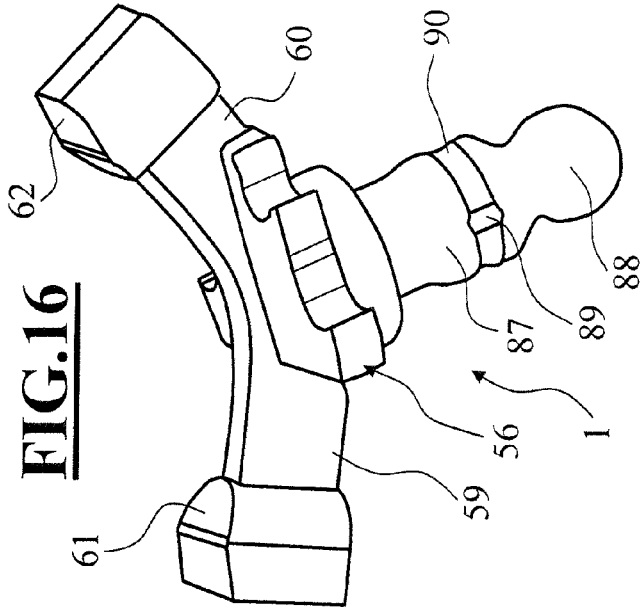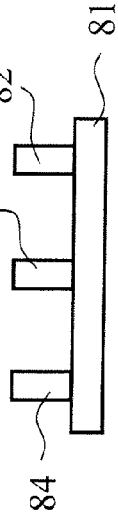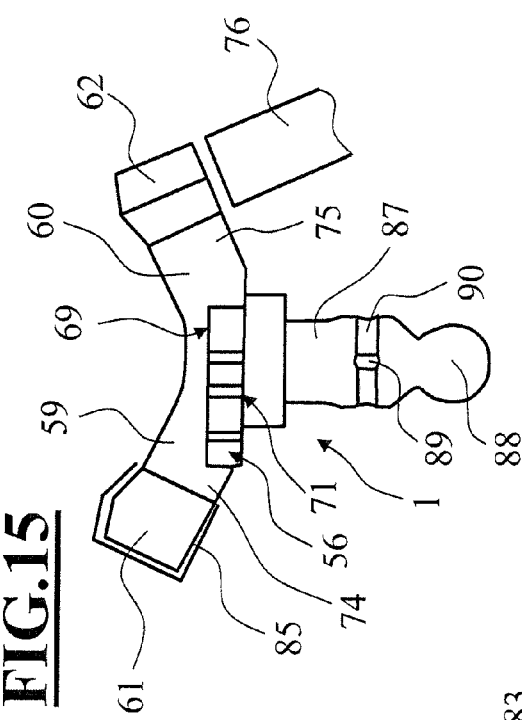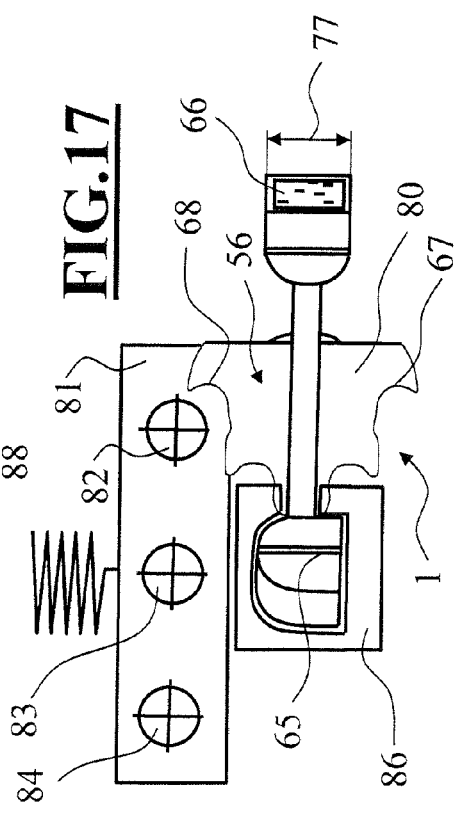

1

TRANSPORT ARRANGEMENT FOR MANIPULATING LENSES

CROSS REFERENCE TO RELATED APPLICATIONS

This application is a continuation application of U.S. patent application Ser. No. 12/929,484, filed Jan. 28, 2011 which, in turn, is a divisional application of U.S. patent application Ser. No. 11/826,722, filed Jul. 18, 2007, which, in turn, is a continuation-in-part application of international patent application PCT/EP 2006/000573, filed Jan. 24, 2006, designating the United States and claiming priority from German application 10 2005 004 006.3, filed Jan. 27, 2005, and the entire content of all of the above applications is incorporated herein by reference.

FIELD OF THE INVENTION

The invention relates to a holding assembly for manipulating lenses with at least one holding element especially during the surface treatment of the lenses. The invention also relates to a transport arrangement for manipulating lenses during the application of a hard coating in a dip trough with a dip frame for accommodating holding devices for the lenses. Finally, the invention relates to a method for finishing lenses wherein the lenses are subjected to different finishing steps in sequence.

BACKGROUND OF THE INVENTION

EP 1295962 A1 discloses a spring holding assembly for lens edges. Such a spring holding assembly can lead to damage at the lens edges when held too tightly and, when held too weakly, a holding force insufficient for the manipulations is provided. Furthermore, it can be seen from this publication that the lens can also be cemented into the holder.

SUMMARY OF THE INVENTION

A first object of the invention is to provide an assembly for holding the lenses, especially, spectacle lenses, which, during processing of the lenses, ensures a tight hold and, thereafter, the lens, especially a spectacle lens, can be removed without damaging the latter.

The holding assembly of the invention is for holding a lens at the edge thereof and includes: a holding device for holding the lens; the holding device including an adhesive connection for holding the lens at the edge thereof; and, the adhesive connection being provided at only one adhesive point or at only two adhesive points spaced from each other.

A tight connection is ensured because the holding element is cementable to the lens edge or is cementable with an adhesive element to the edge of the lens. A breaking or scratching of the lens as is often the case in mechanical and especially in form-tight or force-tight connections is substantially precluded. Furthermore, the embodiment of the invention provides for an arrangement wherein the holding device can be cemented at a point, namely, at one point or two points spaced from each other. One adhesive point can be sufficient but two adhesive points can improve the stability. Point-shaped here does not mean that the adhesive point does not have any spatial expansion. The expansion of the cementing in the peripheral direction is, however, limited in that the support surface of the holding device, which is defined by the adhesive, does not follow the edge contour of the lens or only to a very limited extent and only so far that a sufficient connection is ensured between lens and holding device. A point fixation having a diameter of a few millimeters is sufficient for spectacle lenses usually used having a diameter of approximately 40 mm to 80 mm.

In an especially advantageous variation of the invention, the adhesive connection includes an adhesive element which can be cemented to the edge of the lens. An adhesive element of this kind can, for example, be configured in the nature of segments of a band and/or have a certain spatial expansion. Compared to a liquid adhesive, this variation affords the advantage that an adhesive element can be easily placed at the intended location.

The use of a liquid or pasty adhesive has the disadvantage that special caution must be used in order to prevent that the adhesive is applied to a non-wanted location, especially, to optically active surfaces of the lens. In this case, however, the strength of the adhesive connection is increased even for smaller adhesive surfaces compared to an adhesive which, in general, requires an additional carrier. Furthermore, a precise metering of the adhesive quantity is very easily possible. The spatial expansion of the adhesive point can be individually adapted to the available contact locations on the lens and on the holding element. Accordingly, it can be purposeful to select the point form (adhesive volume) in dependence upon the thickness, especially edge thickness, and/or the size and/or the weight of the lens. The use of metering systems or multiaxial systems for orientating the position of the lens and holding device is likewise advantageous.

It has been shown to be advantageous to provide a holding element for applying the one adhesive point or only two adhesive points which holding element, preferably, projects from the actual holding device and/or is configured as a separate component. The application of the adhesive and the establishment of the adhesive connection itself is simplified thereby.

An especially advantageous variation of the invention provides for two holding elements in the form of two holding arms arranged at an angle to each other. These holding arms (preferably at the ends) are configured for applying respective adhesive points. A metering slot can be provided in each case which can accommodate a liquid or pasty adhesive, for example, in the form of a caterpillar. The metering slot can, for example, have a quadrilaterally-shaped outer contour, a roof-shaped outer contour or even the form of a spherically-shaped or cylindrical depression. With a configuration of this kind, the adhesive is at the desired location even if the actual location of application deviates slightly from the ideal location because of adjustment inaccuracies or the like.

The holding arms are preferably configured to be elastic in order to compensate for stresses, for example, during tempering processes to which the lens including the holding device is subjected.

Sensor means can be provided in order to detect the position, size and shape or the like of the lens as well as the instantaneous orientation to the holding device as may be required. This information can be used to bring the lens into a pregiven position to the particular holding element of the holding device, for example, by means of a robot or the like before the lens is cemented to the holding device. In this way, the influence of an operator and a source of error associated therewith is precluded.

The lens, at its periphery, can have a certain amount of additional material, a so-called sacrificial geometry. This additional material can function as a defined adhesive interface or as a noncritical region which can be cut away. Excessive lacquer, which is applied in a dip process, can be conducted away via the excess material with the lacquer leaving lacquer runoff traces during the subsequent drying operation. This excess material can be a geometry which is the same for a plurality of lenses or the excess material can be a surface edging optimized mathematically.

It is especially advantageous when the adhesive connection is produced with a light-curing adhesive and especially an adhesive which is cured with ultraviolet light. In this way, a controlled joining of the lens and holding device is possible. Lens and holding device can be brought into the desired position relative to each other without concern of a curing of the adhesive taking place. The use of a thermally-curing adhesive is also possible; however, especially some plastic lenses are not temperature resistant to the desired extent so that the use of a light curing plastic is preferred. As an ultraviolet light source, one can utilize long serving, highly efficient and space saving luminescent diodes for cost saving reasons. In general, no radiation conductors are required. Furthermore, one does not need darkening shutters on the light source if the LEDs are switched on only during the exposure step. The LEDs, as a rule, lose less heat because the output power is converted exclusively in the required wavelength range.

In order to be able to cure the light-curing adhesive in a targeted manner and from an easily accessible side of the holding device, it has been shown to be very advantageous when the holding device (especially, the holding element or the holding elements) has a light transmitting region for curing the adhesive. A light transmitting region of this kind can, for example, be made available by utilizing a material, which is adequately light transmissive in the decisive spectral range, for the manufacture of the holding device. It is, however, also possible to configure the holding device locally transparent in the desired range, for example, by providing a cutout or introducing another material in the holding device.

It has been further shown to be favorable when an inscription is applied to the holding device by means of which this holding device can be clearly identified. The inscription can, for example, be applied with the aid of a laser. The inscription can be a data matrix code or include the same. The tracking of an individual order can take place via a corresponding standardized data matrix code (paperless manufacture).

It has been shown to be favorable when the holding device has a holding element for holding the holding device on a transport arrangement. Alternatively to a separable holding means, an attachment device can be provided for preferably releasably attaching the holding device to a transport arrangement.

In the first mentioned case, it has been shown to be advantageous when the holding element is so configured or coacts in such a manner with the transport arrangement that the holding device is held almost without contact. An almost contactless holding is here understood to be that mechanical forces operate only insofar as they are needed for the defined orientation of the holding device with reference to the transport arrangement but not with respect to the carrying support of the transport arrangement.

Preferably, the holding element has an element of a magnetic or magnetizable material. Corresponding thereto, the transport arrangement has a counterelement of a magnetizable or magnetic material in order to hold the holding element by means of a magnetic force almost without contact. The holding element can, for example, be configured in the manner of a guide cylinder which has a round head with an integrated (magnetizable) steel core. The spherical head can, with the aid of a magnet assigned to the transport arrangement, be brought into a defined position without the holding device being noticeably supported on the transport arrangement.

It is understood that a holding element of the type noted above can be used also in conventional holders as they are known from the state of the art.

In a lens finishing process, namely, for example, when the lens is processed on the forward and rearward sides and is especially coated, it happens again and again that one of the two sides is damaged when the lens is turned from one side to the other side. On the one hand, this can occur because a turning is often still done manually and, on the other hand, in general, an application to one of the two sides or to the edge takes place. The invention provides for a turning arrangement for turning the lens which is a component of the holding device. Turning the lens from one side to the other is then not necessary and the risk of damage to the lens is virtually precluded.

An especially simple variation of a turning arrangement for turning the lens comprises configuring the turning arrangement as a turning tooth system.

In addition, it has been shown to be advantageous when an attachment device is provided for attaching the holding device to a transport arrangement. It is advantageous when the attachment device is configured as a latch unit. On the one hand, the connection is simple to make and, in general, can be again released. The manipulation is thereby greatly simplified.

Finally, it is advantageous to provide means to ensure the holding device against a rotation on the transport arrangement. A dropping out of the lens and a collision with items arranged in the vicinity is thereby substantially precluded.

In order to improve the adherence of the adhesive on the surface of the holding device intended therefor, the surface is at least partially configured in the manner of an orange skin on which the adhesive can very well adhere and this is according to another feature of the invention. At the same time, this surface provides that a lacquer adheres very well to the surface of the holding device so that it does not detach in subsequent process steps and precipitate onto the lens carried by the holding device, for example, in a dip bath process.

Such a holding device can be used in the finishing of optical lenses in the spectacle glass industry. The finishing process includes, generally, the stations: washing, hard coating, tempering and, if needed, the application of an antireflection coating as well as a so-called clean coat coating. At the present time, different lens holders are used for the individual stations at least in part because the lenses are manipulated differently at each station.

The lenses are mostly circular in shape but can have forms which deviate therefrom. The lens diameter runs generally between 40 to 80 mm.

With the arrangement of the invention for holding a lens, the lens can remain in a holder during the entire finishing process which is made up of several finishing steps.

In a preferred embodiment of a holding device for lenses held at the lens edge, this holding device is usable for a plurality of different diameters and geometric shapes of lenses. In the manufacture of spectacle glass, diameters of 40 to 80 mm as well as elliptical lenses are usual. However, there are also spectacle lenses which have other dimensions and geometric shapes. In addition, the arrangement of the invention is not limited to spectacle lenses but can be utilized everywhere where lens-shaped objects are to be manipulated.

In one embodiment of the invention, the holding element can have a rod shape, especially a cylindrical rod shape having a flattening at the end to be cemented. However, other forms such as rectangles, triangles and polygons, et cetera are possible. Also, the holding device can include a holding comb, at least one holding rider insertable into the holding comb and at least one adhesive element with which holding rider and lens edge can be connected. The holding riders can be provided with bores wherein a gripper can be introduced. The gripper can be part of the fully automatic finishing process of lenses.

Furthermore, it can be provided that the holding elements are configured as a link chain having several link elements. These link elements can also be provided with bores wherein a gripper can be introduced for fully automatically manipulating the finishing steps. An adhesive element can be assigned to at least one link chain element.

Holding elements of the most different configuration are conceivable. Preferably, injection molded disposable parts of polycarbonate are used. However, other materials can be used especially metals. Also, reusable holding elements can be used.

The adhesive elements can be configured as adhesive drops or double-sided adhesive bands. Of course, still other configurations of adhesive elements are conceivable. Preferably, an adhesive is used which can be cured under ultraviolet light.

In a preferred embodiment of the invention, a holding element is provided with a coding, especially, a prescription coding. The coding can be configured as a data matrix code or bar code. Microchips or other data carriers are conceivable. The coding can contain the prescription values of a customer, for example, sphere, cylinder, axis as well as invoice date and invoice number and additional data which is viewed as being helpful. Up to now, the prescription slip is always transported parallel to the lens to be finished. Conventionally, this lens is taken in hand several times because different lens holders are used for different finishing steps. Here, mix ups can result which must be avoided. With the direct application via the holding device to the lens, data can no longer become lost or be incorrectly assigned. The coding is stamped, impressed or applied with a laser.

It is a further object of the invention to provide a transport arrangement for manipulating lenses during the application of a hard coating in a dip trough which makes it possible to coat lenses without the formation of streaks or runoff traces caused by dripping from holding devices.

The transport arrangement of the invention is for manipulating lenses during the application of a hard coating in a dip trough. The arrangement includes: a plurality of holding devices for holding corresponding ones of the lenses; a dipping unit having a frame defining receiving members for receiving the holding devices thereon; and, the holding devices being arranged on the frame so as to cause each of the lenses to be disposed above and/or laterally of the holding device assigned thereto.

Residues from the dip bath can no longer slide onto the lenses from the holding device because the holding device, which is loaded with a lens, is so arranged on the dip unit that the lenses are disposed above and/or laterally of their holding device.

The holding device can be arranged precisely perpendicularly under the lens. However, lateral arrangements are also conceivable as long as the criterion is satisfied that no dip bath residues can reach the lens where the residue can cause streaks to form. For this purpose, a holding device according to the invention can be used.

A further object of the invention is to provide a method for finishing lenses. The lenses are subjected to sequentially occurring different finishing steps without it being necessary to have an operator manually touch the lens.

The method of the invention is for finishing lenses wherein the lenses are subjected to different finishing steps of a finishing process in sequence. The method includes the steps of: cementing each of the lenses with adhesive to a corresponding one of a plurality of holding devices at one point or at two points separated from each other; and, exclusively utilizing the same ones of the holding devices throughout the finishing process.

The lenses are exclusively connected to the same holding device during the finishing process. For this reason, the lenses need not be touched by an operator as is conventional at the present time. Contamination from shed skin, hairs, fingerprints are avoided and the danger of glass breakage is less because no exchange of the holding device takes place.

In the method of the invention, the lens can be cemented to the holding device.

The finishing process can include the finishing steps of: washing, hard coating and tempering. The finishing process can include a finishing step for applying an antireflection coating. The finishing process can include a finishing step for applying an anticontaminant coating.

A further object of the invention is to provide a turning unit for turning the lenses in the lens holders, for example, during the finishing process. The turning arrangement is built up comparatively simply and is robust and functions reliably and is comparatively cost effective to manufacture.

The turning arrangement of the invention for turning a holding device holding a lens at its lens edge is characterized in that it includes a turning tooth system assigned to the holding device and a translatorily movable turning element coacting with the turning tooth system. The translatorily movable turning element engages into the turning tooth system of the holding device such that the translatory movement of the turning element is converted into a rotation movement rotating the holding device. The turning tooth system and the turning element are preferably so matched to each other that the holding device completes a 180° rotation so that the two sides of the lens can exchange their alignment. If, for example, at first, the forward side of the lens is coated, then the back side of the lens can be coated after turning.

It is sufficient when the turning tooth system includes only two teeth between which the turning element can engage. A turning arrangement of the invention is therefore comparatively simply built up.

The turning tooth system is preferably arranged on the outer periphery of a ring or circularly-shaped holding plate. The holding plate is preferably rotatably arranged about a rotation center and is especially suspended or supported. This variation is characterized by its simple geometric configuration and therefore is cost effective to manufacture.

The turning element can, for example, be configured as a pin which, for example, can engage between the two teeth of the tooth system.

The turning element can, for example, be arranged on a wagon to which, for example, a translatory movement can be imparted via a chain or a pull line. The turning element can also be part of the chain or pull line.

BRIEF DESCRIPTION OF THE DRAWINGS

The invention will now be described with reference to the drawings wherein:

FIG. 10 is a holding device according to another embodiment of the invention which carries a lens having a sacrificial geometry and this is shown compared to a holding device holding a lens without a sacrificial geometry;

FIG. 15 is a plan view of a seventh embodiment of a holding device according to the invention with two elastic holding arms as well as a turning arrangement of the invention;

FIG. 16 is a perspective view of the embodiment of FIG. 15;

FIG. 17 is a side elevation view of the embodiment of FIG. 15; and,

FIG. 18 is a side elevation view of a wagon of the turning arrangement of the invention of FIG. 15.

DESCRIPTION OF THE PREFERRED EMBODIMENTS OF THE INVENTION

Figure 1:
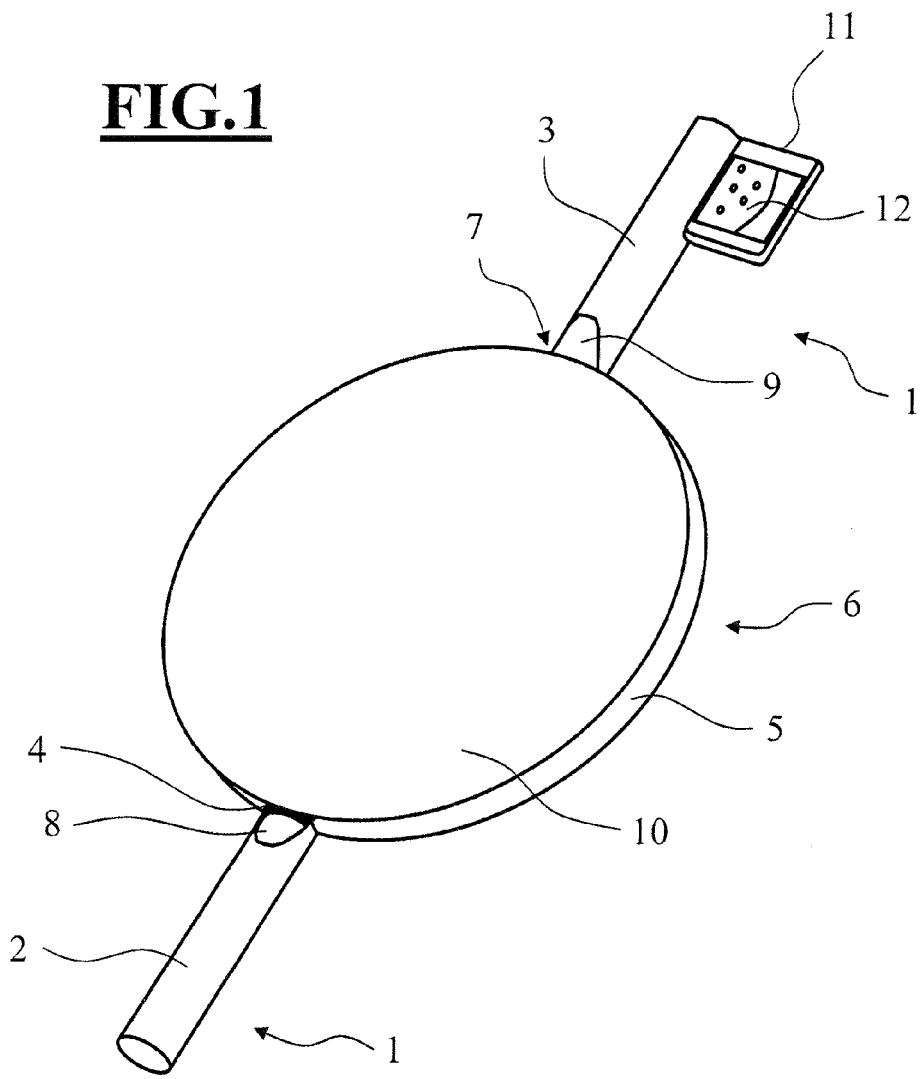
FIG. 1 is a perspective view of a first embodiment of a holding device according to the invention having a rod configuration with coding.

FIG. 1 shows a first embodiment of a holding device 1 having a first holding element 2 and a second holding element 3. The first holding element 2 is cemented with an adhesive element 4 onto the lens edge 5 of a lens 6. The second holding element 3 is cemented with an adhesive element 7 to the opposite-lying position of the lens 6 at its lens edge. The holding elements (2, 3) define support arms projecting from the lens 6.

One such holding device 1 can be used in the finishing of lenses 6, especially, plastic lenses in the spectacles industry. A finishing process of this kind includes several finishing steps. Usually, the lenses 6 are subjected to a finishing process after the end of the geometric shaping of the surface 10.

A first finishing step can be the washing of the lenses 6. Then a coating process can follow with wetting both surfaces wherein the lenses 6 are provided with a hard coating. Thereafter, a tempering can take place during which the hard coating is strengthened. As further finishing steps, various antireflection coatings can be applied. In addition, a hydrophobic coating for repelling dirt (clean coat) is possible as a further finishing step. Most of these finishing steps take place in a high vacuum. In conventional methods, different holding devices are used for different finishing steps. With the device of the invention, all finishing steps can be run through with one and the same holding device (also in high vacuum).

The holding element (2, 3) is configured to be flattened or beveled in the region of the end (8, 9) to be cemented. In this way, the holding element (2, 3) can also be attached well to thin lens edges without the adhesive mass reaching the lens surfaces 10 beyond the lens edge 5.

The lens 6 is preferably made of plastic, however, other materials, for example, silicate lenses are conceivable. Also, polycarbonate lenses can be used.

The holding device 1 can already be provided with adhesive elements (4, 7). The adhesive element (4, 7) can be protected by a protective foil which is removed only shortly before the connection to the lens 6, for example, the protective foil can be in the form of a double-sided adhering adhesive foil. In lieu of such a foil type adhesive element (4, 7), a drop of adhesive can be used which is only applied for cementing to the lens edge 5 at an end of the holding element (2, 3). The adhesive can then cure in the air.

Preferably, an adhesive drop is applied with an adhesive nozzle. Curing is preferably provided under ultraviolet light. It can also be provided that the (solid or liquid) adhesive element (4, 7) is applied to the lens edge 5 in order to cement the holding element (2, 3) to the lens edge 5. A point cementing is effected in accordance with the invention.

The holding elements (2, 3) are knocked off the lens edge 5 after the finishing of the lens 6. It is also conceivable to dissolve the adhesive connection by means of a chemical agent or temperature differences or mechanically.

The holding element (2, 3) can be used again. Preferably, disposable parts are used which, for example, can be made by means of an injection molding process. The holding elements (2, 3) can be made of polycarbonate or other plastics. Other materials are also conceivable, for example, metals or ceramic.

The holding element 3 is provided with a flag 11 in the present embodiment. A code is applied to the flag 11. This code 12 can include the most varied data, for example, the code can include the prescription slip of the customer with spherical, cylindrical and axial values as well as an order number, special wishes of the customer, order date, quality data and much more.

In conventional finishing steps, the prescription slip of the patient is of paper and runs next to the apparatus during the finishing process of the lens 6 corresponding thereto. Here, a mix-up can easily occur. In contrast, in the holding device 1 according to the invention, the prescription slip is always connected to the corresponding lens 6 and cannot become lost or be assigned to an incorrect lens.

In FIG. 1, two holding elements 2 and 3 are shown and it is understood that only one holding element can be used. The adhesive element (4, 7) should provide an adequately high strength so that the lens 6 can be subjected to the most varied movement sequences during handling. The connection between the holding elements (2, 3), adhesive element (4, 7) and lens 6 should permit a transport of the lens in the horizontal without the lens tilting and falling off.

Lenses 6 of the most varied form and different diameter can be manipulated with the holding device 1. Lenses are mostly configured to be circular in shape but can have other forms, for example, oval forms or free forms. The lens diameters vary usually between 40 mm and 80 mm. Here too, deviations upwardly or downwardly are conceivable.

Figure 2:
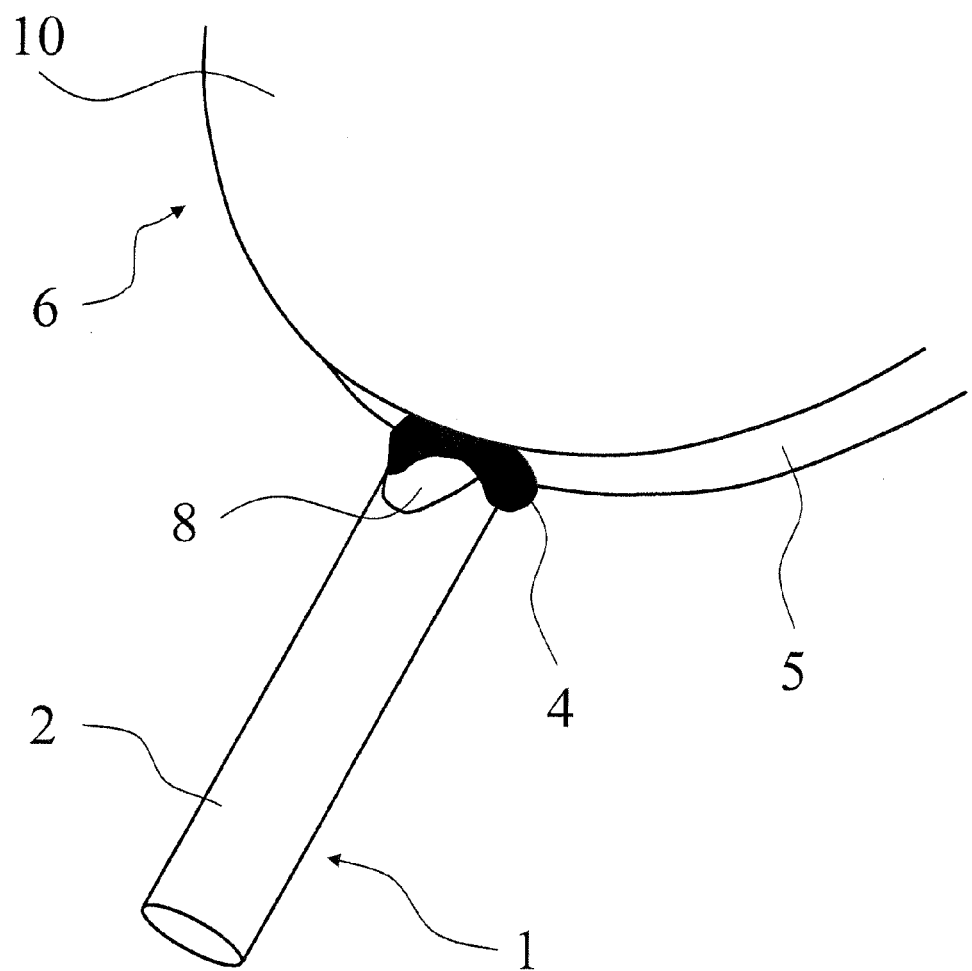
FIG. 2 is an enlarged detail view of a portion of the holding device of FIG. 1.

In FIG. 2, an enlarged cutaway portion of FIG. 1 is shown which clearly emphasizes the adhesive point 4. With the adhesive point 4, the holding element 2 is cemented to the lens edge 5. With the adhesive point 4, the holding element 2 is cemented to the lens edge 5 and the adhesive point does not extend over the lens edge 5 onto the lens surface 10. The lens surface 10 can therefore be finished in its totality.

Figure 3:
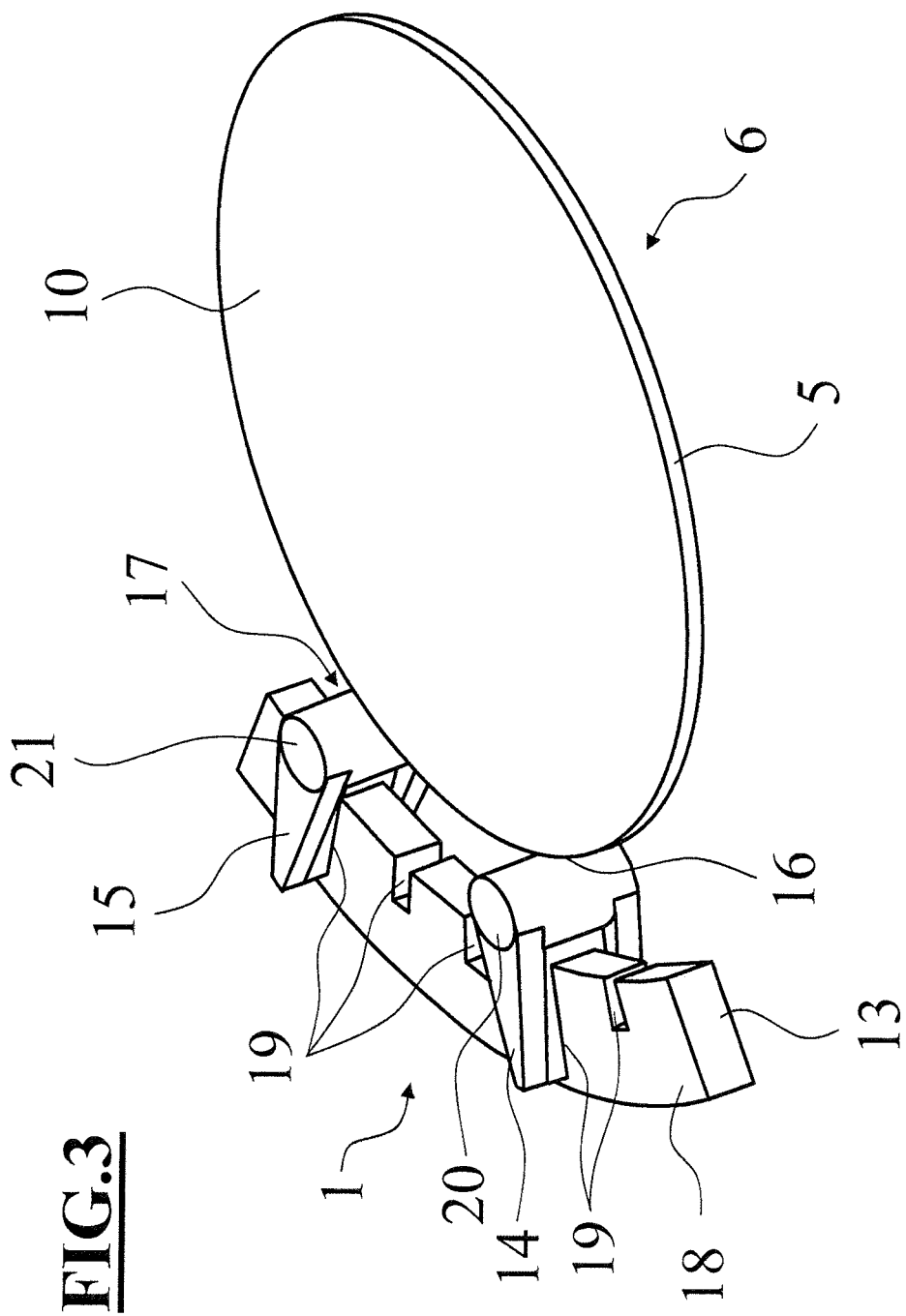
FIG. 3 is a perspective schematic of a second embodiment of the holding device according to the invention with holding riders.

FIG. 3 shows a further holding device 1 comprising a holding comb 13, holding riders 14 and 15 and adhesive elements 16 and 17. The holding comb 13 is preferably a ring segment 18 having notches 19. Holding riders (14, 15) are inserted into two of these notches 19. The holding riders (14, 15) are inserted in different notches 19 depending upon the size of the lens which is to be held. In this way, lenses 6 of different diameters can be held. The holding comb 13 can also have other forms in lieu of the form of a ring section 18, for example, the holding comb 13 can have the form of an elliptical section. Bores (20, 21) are formed in the holding riders 14 and 15. For the further handling, for example, a gripper (not shown) can engage in the bores (20, 21) and, in this way, bring the lens 6 held from one finishing step to the next. A coding is not shown but it is understood that a coding can be applied.

Figure 4:
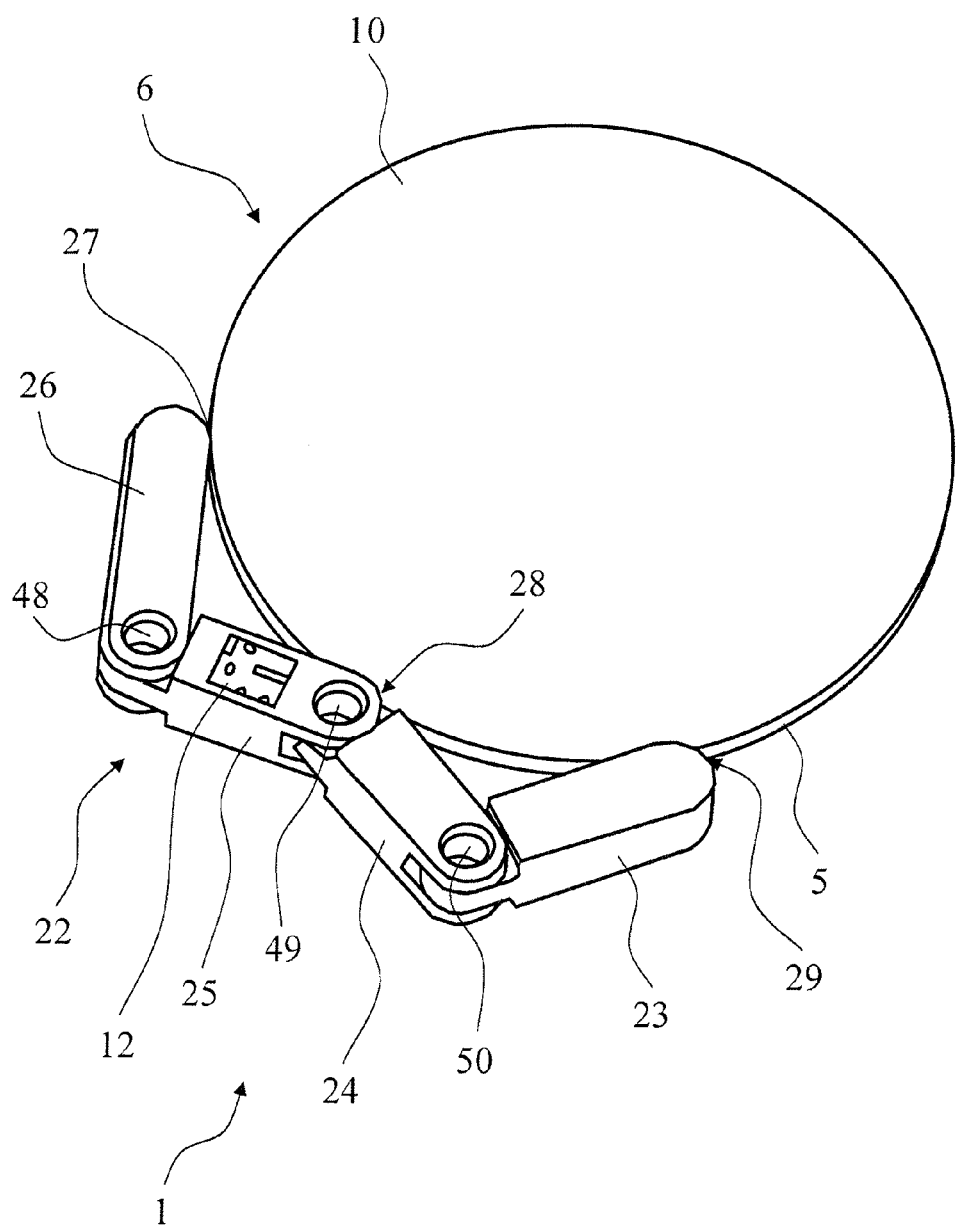
FIG. 4 is a perspective view of a third embodiment of a holding device according to the invention having interconnected links and coding.

FIG. 4 shows a third embodiment of a holding device having a holding element in the form of a link chain 22 having four link elements (23, 24, 25, 26). The link chain is connected to a lens 6 via adhesive elements (27, 28, 29). Here, three possible positions for applying the adhesive elements are shown. It is, for example, conceivable to use only the adhesive elements 27 and 29. The adhesive element 28 can be either completely omitted or can be provided with a protective foil so that no adhesion with the lens 6 takes place. The lenses 6 of the most different geometrical configuration can be held because of the different angle arrangements of the individual chain links 23 to 26. The number of chain links can vary, for example, in dependence upon the lens diameter and lens weight. Whereas only one or two of the chain links act to hold in that they are cemented to the lens, the remaining chain links can function to support the lens.

A chain link 25 is provided with a code 12. This code can, for example, be impressed, stamped, laser signed or applied with adhesive.

The link chain 22 is also provided with bores (48, 49, 50) in this embodiment wherein a gripper (not shown) can engage for the further manipulation.

Figure 5:
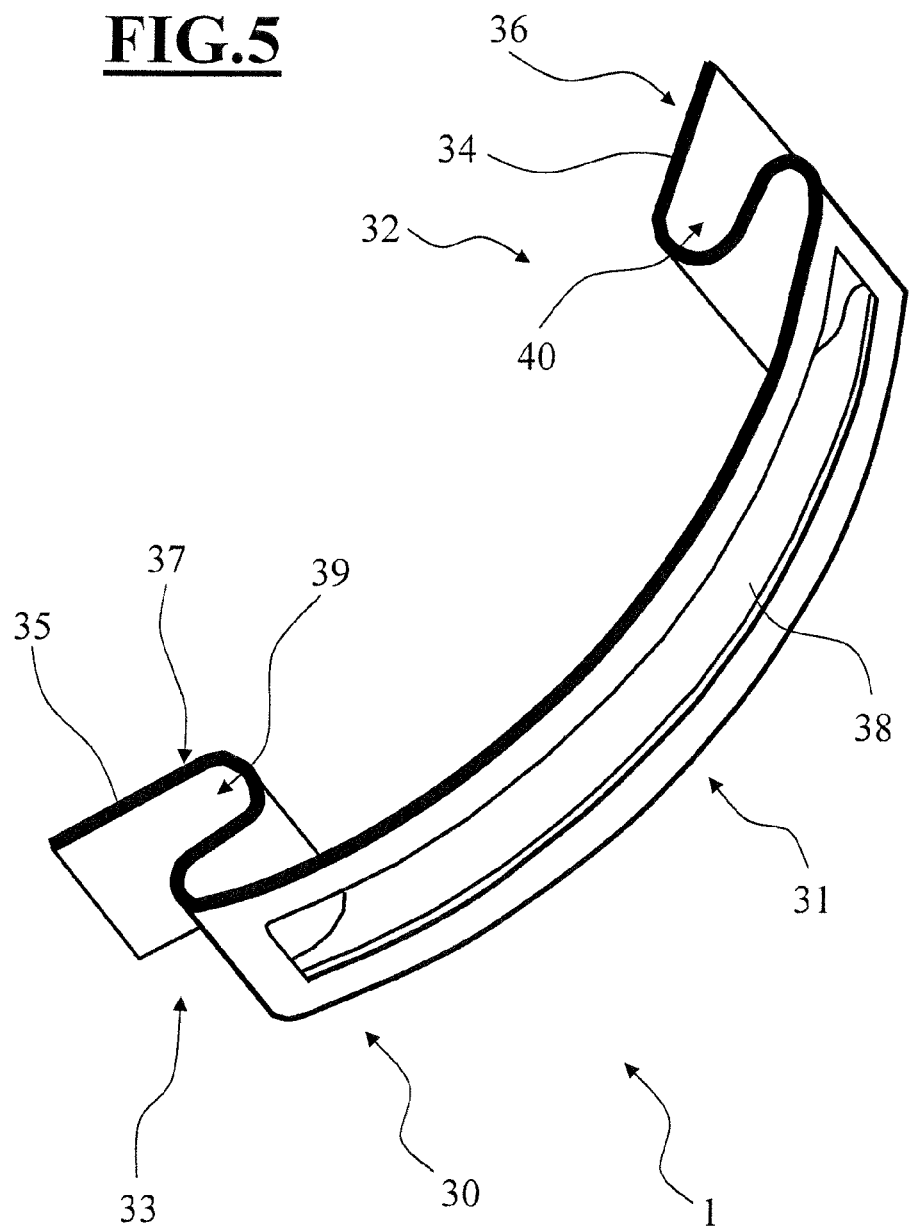
FIG. 5 is a perspective view of a fourth embodiment of a holding device according to the invention having a holding spring. The holding spring has contact surfaces on which respective adhesive connections are generated. A holding spring is used for applying a hard coating. The holding spring is complemented by a second cemented holding spring for the finishing steps of an anti-reflection coating and a clean coating (hydrophobic coating)

FIG. 5 shows a fourth embodiment of a holding device 1 wherein the holding element 30 is configured similarly to a leaf spring. The holding spring 30 is bent in the mid region 31 and is configured to have an S-shape in the two end regions (32, 33). The end piece (34, 35) of the S-shaped region is configured to be lengthened to the end of the holding spring 30. Adhesive elements (36, 37) are applied to these end pieces (34, 35). The mid region 31 is provided with a slit 38. The holding spring 30 is configured to be bendable. For this reason, the holding spring 30 can be adapted to different radii of a lens edge (not shown). A gripper (not shown) can engage in the slots (39, 40) for the further manipulation in the finishing steps. The slots (39, 40) are defined by the S-shape.

Figure 6:
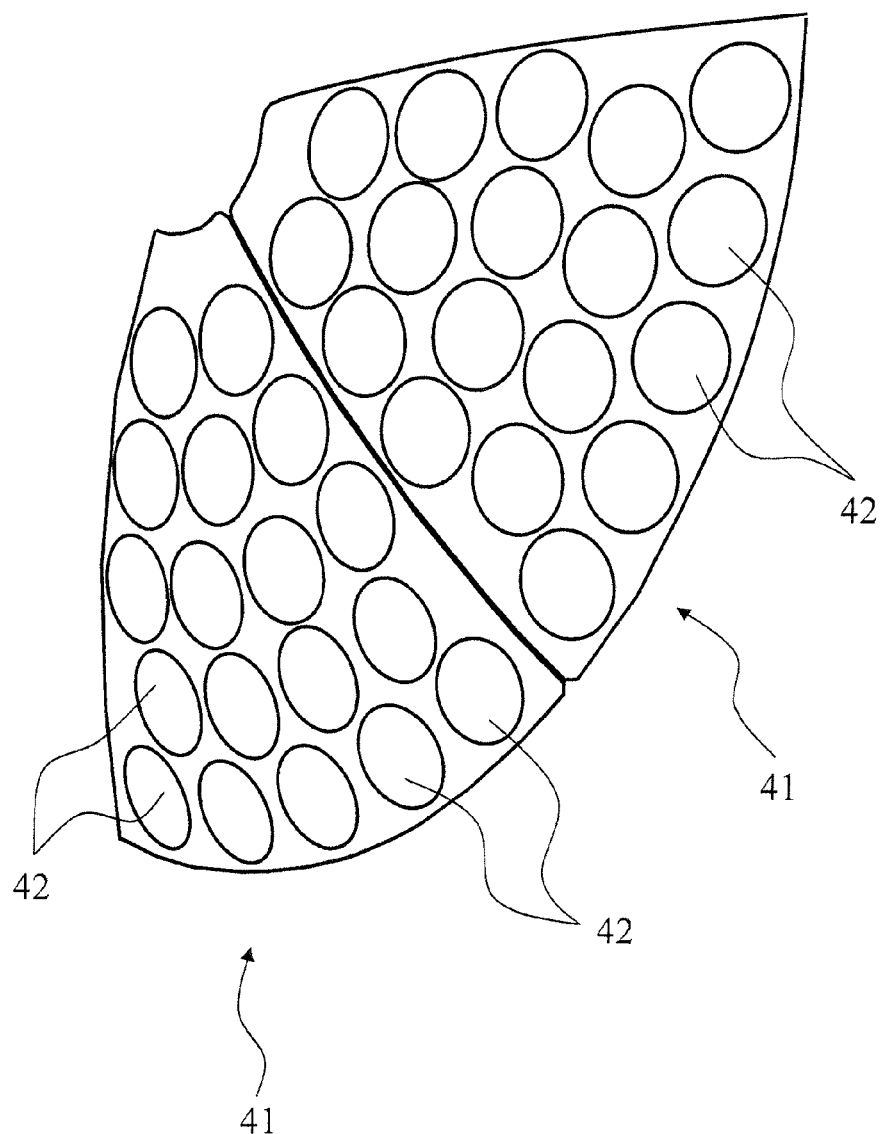
FIG. 6 shows two segments of a lens holder having a spherical configuration in accordance with the state of the art.

FIG. 6 shows two segments 41 of a spherically-shaped holder as used, for example, in the coating with an antireflectant coating. A spherically-shaped holder built up, for example, of 6 to 8 holder segments 41 has, simplified, the form of a hollow spherical cap and is provided with a plurality of holes 42 for lenses (not shown). The holes 42 are provided with reference numerals only by way of example.

Figure 7:
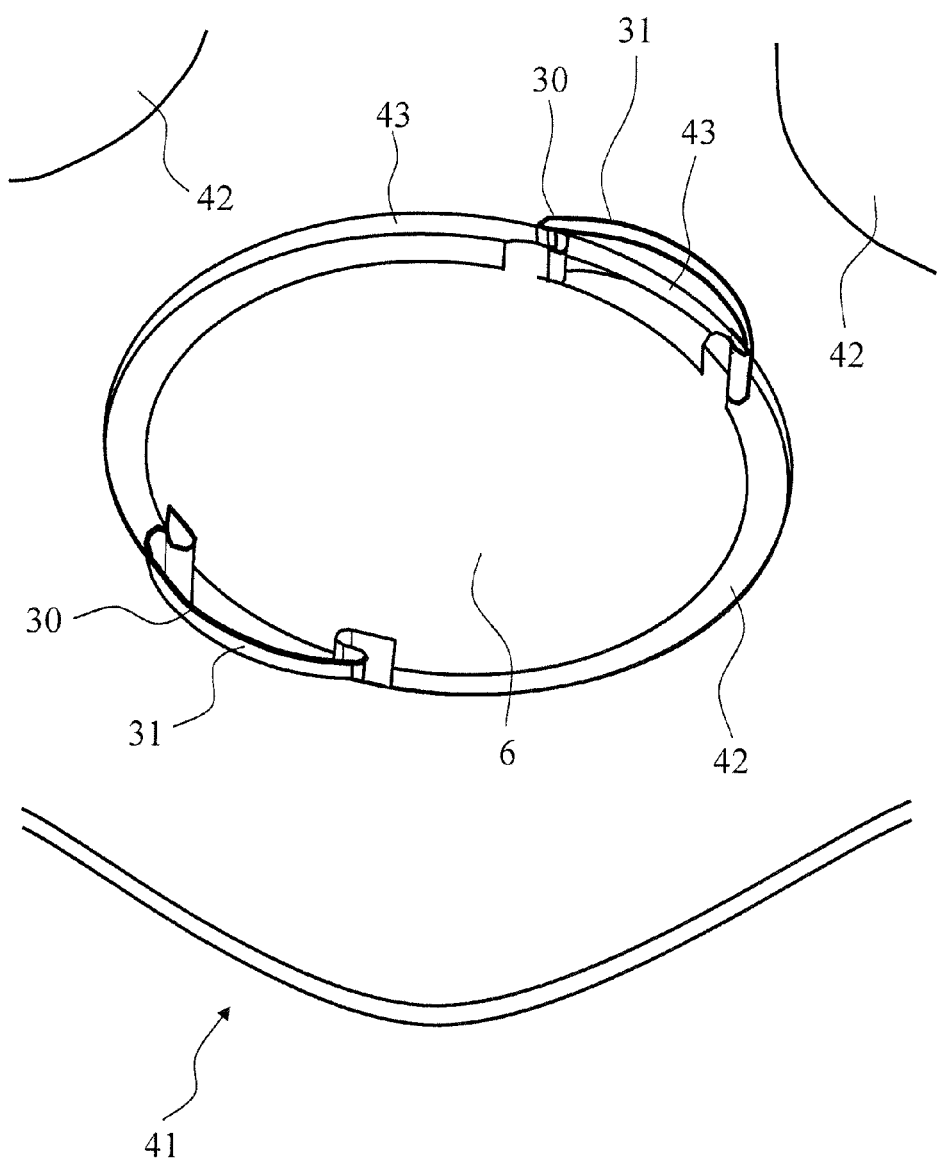
FIG. 7 is a cutaway view of a detail of a segment of a spherically-shaped lens holder according to the state of the art with a lens and cemented holding springs as described with respect to FIG. 5.

In FIG. 7, a lens 6 is seated in one such hole 42 of a spherically-shaped holder segment 41 shown as a cutaway portion. This lens 6 has two holding springs 30 with two possibilities for cementing, respectively, as shown in FIG. 5. It is understood that the use of only one holding spring 30 is conceivable. The lens 6 is held well in the hole 42 by the holding spring 30 with some of the edge of the hole side wall 43 engaging in the slit 38. For this purpose, the bending of the mid region can be to a higher or lesser degree depending upon what is placed into the hole 42 of the lens holder segment 41 for a good grip. With this arrangement of the hole, a good coating of the lens is guaranteed by the vapor coming from below.

Figure 8:
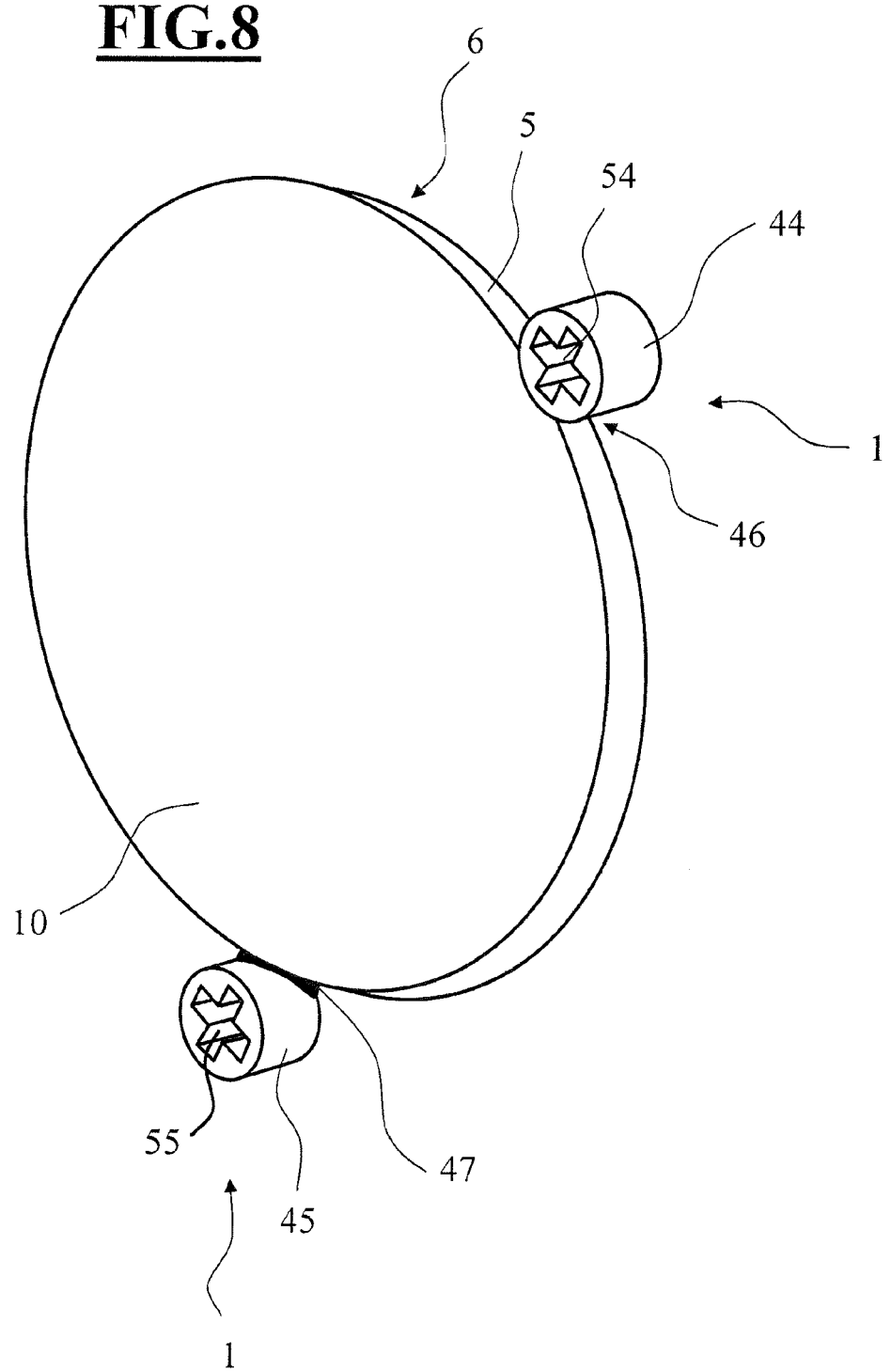
FIG. 8 is a fifth embodiment of a holding device according to the invention having two holding cylinders.

FIG. 8 shows a further holding device 1 having two holding cylinders (44, 45) which are connected to the lens edge 5 of a lens 6 via adhesive elements (46, 47). The holding cylinders (44, 45) have cross-shaped bores (54, 55) into which a gripper (not shown) having preferably a cross-shaped gripper arm can engage for further manipulation.

Figure 9:
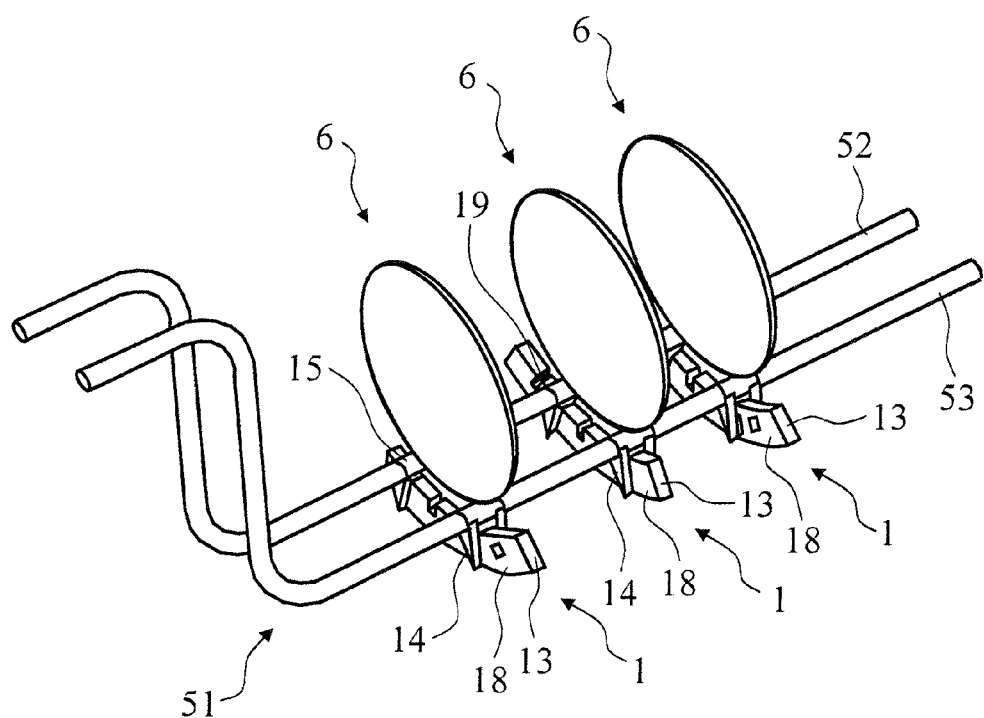
FIG. 9 is a perspective schematic of a transport arrangement according to the invention for manipulating lenses when they are supplied with a hard coating.

FIG. 9 shows a transport arrangement of the invention for manipulating lenses 6 for applying a hard coating in a dip trough (not shown). The transport arrangement 51 has two grip rods (52, 53) of a fully-automatically driven gripper (not shown) which, for example, accommodates three of the holding devices 1 shown in FIG. 3 and lowers these holding devices into the dip trough (not shown) and thereafter again takes the holding devices out of the dip bath and takes the same to the next finishing step. The accommodation of the holding devices 1 of FIG. 3 takes place in that the grippers (52, 53) are inserted into bores (20, 21) of the holding riders 14 and 15. With the arrangement of the holding device 1 below the lenses 6, a dripping is prevented after the dip operation from the holding device 1 onto the lens 6.

Spectacle lenses are often optimized with respect to their thickness. Plus glasses having optimized (that is, minimized) center thicknesses therefore often have an outer peripheral course wherein a holding via an adhesive in accordance with the invention can only be applied with difficulty with the required holding stability. Preferably, the margin regions of the lens are at least provided with a suitable section.

FIG. 10 shows a holding device 1 which carries a spectacle lens 6 having an optimized center thickness. To the left, the holding device 1 is shown when it carries a spectacle lens 6 finished in the conventional manner. The illustration on the right-hand side shows the holding device 1 with a spectacle lens 6 having a sacrificial geometry 91. The sacrificial geometry is an additional amount at the glass periphery 5 of the spectacle lens 6.

From the left-hand view, it can be seen that a lens 6 having a small radius of curvature must be held at adhesive points 4 spaced very closely (distance $d_1$). The sacrificial geometry 91 can be so selected that its curvature permits to arrange the adhesive points 4 for holding the lens at a very large distance $d_2$. Furthermore, a sacrificial geometry 91 of this kind affords the advantage that the adhesive points 4 do not have to be arranged on the effective surface of the spectacle lens 6. Furthermore, it is possible to provide defined coordinates for the location of the adhesive points 4. Finally, the outer contour of the sacrificial geometry 91 is adapted in such a manner to the holding elements (2, 3) of the holding device 1 that there is always a sufficient or optimal contact surface between sacrificial geometry 91 and the holding elements (2, 3).

Figure 12:
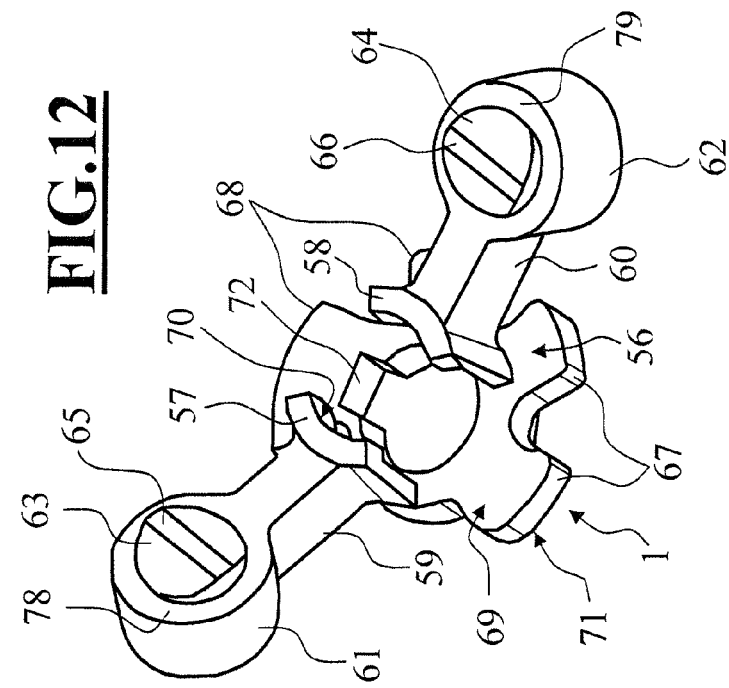
FIG. 12 shows the embodiment of FIG. 11 in a perspective view.
Figure 11:
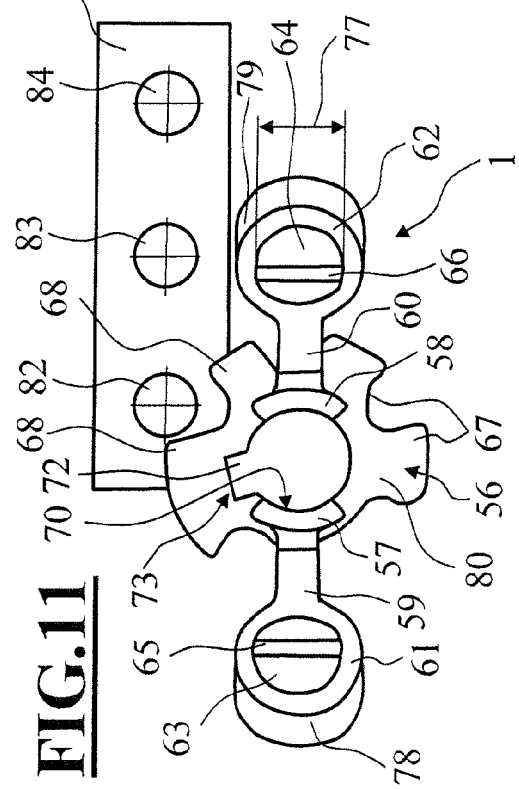
FIG. 11 is a sixth embodiment of a holding device according to the invention having two elastic holding arms and a turning arrangement in plan view from above.
Figure 13:
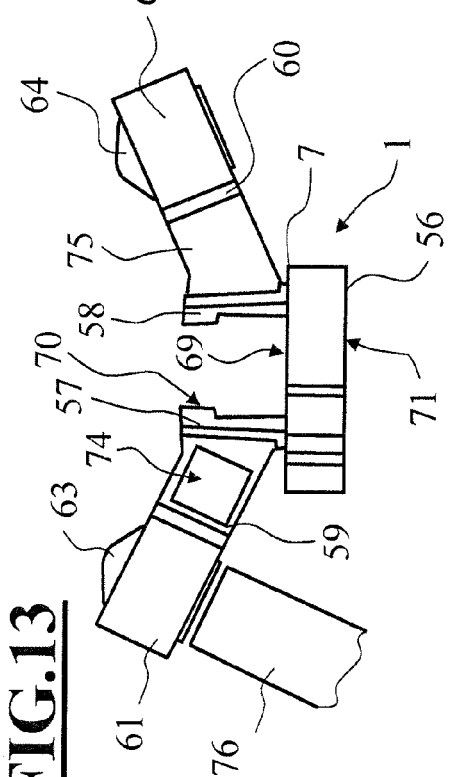
FIG. 13 is a side elevation view of the embodiment of FIG. 11.
Figure 14:
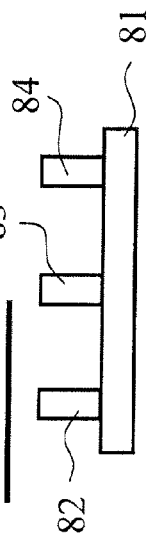
FIG. 14 is a side elevation view of a wagon of the turning arrangement of FIG. 11.

FIGS. 11 to 14 show a sixth embodiment of a holding device 1 according to the invention having two holding arms (59, 60) and a turning arrangement (81, 82, 83, 84, 68) in different views. FIG. 11 shows the holding device 1 together with the turning arrangement in plan view from above. FIGS. 12 and 13 show the holding device 1 in a perspective view and a side elevation view, respectively. FIG. 14 shows the wagon 81 of the turning arrangement (81, 82, 83, 84, 68) of the invention in a side elevation view.

The holding device 1 is based on a base plate 56, which is essentially circularly-shaped, as well as two holding arms (59, 60) which are arranged at an angle with respect to each other and at an angle with respect to the base plate 56.

According to the invention, the holding device 1 is made of unbreakable material resistant to temperatures up to over 150° C. The material is further alkaline resistant, acid resistant, resistant to solvents as well as being resistant to ultrasound in order to withstand cleaning procedures, injection processes and rinsing processes. It can be used in high vacuum and in clean rooms. Furthermore, it dampens structure-borne vibrations. In the present embodiment, the holding device 1 is essentially one piece (see the description which follows) of polyphenylenesulphone.

The holding arms (59, 60) define a plane which is coincident essentially with the main plane of a lens to be accommodated (not shown here). Furthermore, the two holding arms (59, 60) have a certain elasticity in order to take up tempering stresses or the like or to compensate therefor without the accommodated lens sustaining damage.

The two elastic holding arms (59, 60) have, at their ends, respective heads (61, 62). Each of the heads (61, 62) is annularly-shaped in the form of an outer jacket (78, 79). Each of the outer jackets (78, 79) accommodates a light-transmitting cementing pin (63, 64) of material permeable to ultraviolet light. Polycarbonate is used in the present embodiment. This light-transmitting cementing pin (63, 64) is configured to have a cylindrical shape. Each light-transmitting cementing pin (63, 64) has a flattened end as well as an end terminating in a roof-shaped tip. The tip-terminating end includes a metering slot (65, 66) for accommodating an adhesive bead.

In order to connect a lens (not shown here) to the holding device 1, a liquid or pasty UV-hardening adhesive is placed in the metering slots (65, 66). The lens is seated on the two metering slots (65, 66) filled with adhesive and this is done in such a manner that the imaginary plane, which is formed by the holding arms (59, 60), and the main plane of the lens are essentially coincident. The holding arms (59, 60) are arranged at an angle to each other in such a manner and so dimensioned with respect to their dimensions that lenses having radii between 20 and 40 mm can be seated on the light-transmitting cementing pins (63, 64) without the outer edges of the lenses touching additional parts of the holding device 1. If now the adhesive, which is disposed in each metering slot (65, 66), is illuminated with the aid of a light conductor 76 as indicated in FIG. 13 from behind with ultraviolet light through the respective cementing pins (63, 64), then the adhesive in the metering slot is cured and a point-shaped adhesive connection is formed which connects the outer edge of the lens to the holding device 1. For clarity, the length of the adhesive is indicated with the aid of a double arrow identified by reference numeral 77. Depending upon the application (here, for example, finishing lenses), it is important that the adhesive satisfies the requirements, which are imposed on the holding device 1, such as temperature resistance, acid resistance and/or alkaline resistance, et cetera.

The entire surface of the holding device 1 is configured in the manner of an orange skin. In this way, a reliable adherence of lacquer to the holding device is ensured during the application of a hard coating to the lens thereby preventing a separation of the lacquer from the holding device in further processing steps such as washing.

The two holding arms (59, 60) have respective grip surfaces (74, 75) which are here so configured that a mechanical gripper can grip the holding device 1. It can also be configured somewhat larger than shown in FIG. 11 in order to make gripping by a person possible.

The connection between the base plate 56 and the holding arms (59, 60) takes place via two vertical webs (57, 58) which project essentially perpendicularly from the surface 69 of the base plate. These vertical webs (57, 58) are here configured to have the shape of annular segments for reasons which will be explained hereinafter.

The base plate 56 has a central opening so that a cylindrical pin (not shown here) can be introduced through this opening and the inner walls of the vertical webs (57, 58) from the rear side (indicated here by reference numeral 71) of the base plate 56. The opening in the base plate 56 additionally includes a slot which functions as a bayonet guide 72 for the cylindrical pin with an appendage, which is introduced from below, whereby a relative movement between the holding device 1 and the pin (which, for example, is a component of the transport arrangement) is prevented.

At the inner periphery of the vertical webs (57, 58), there is an index bore 70 which functions to axially fix the holding device 1 on the cylinder pin of the transport arrangement (not shown) and to accommodate the holding device 1 in a spherically-shaped member. The surface 69 is configured as a support device or end position latch surface 73 for a latch nose assigned to the cylindrical pin of the transport arrangement (not shown) whereby the holding device 1 can be held so that it does not drop off but is releasable from the transport arrangement. The lower side of the base plate 56 functions as a contact/support surface 71 of the holding device 1 on the transport arrangement.

The base plate 56, which is essentially annular in shape, has a turning tooth system (67, 68) at the peripheral outer side and at both sides to the plane defined by the two holding arms (59, 60). Basically, it would be sufficient to provide such a turning tooth system 67 or 68 only on one side of the imaginary plane. Each of these turning tooth systems (67, 68) comprises essentially three teeth in the present embodiment between which a guide pin (82, 83, 84) or a tooth of another tooth system or the like can grip.

The holding device 1 can, for example, be rotatably journalled with the aid of a cylindrical pin (as described above but not shown) which is guided through the opening in the base plate 56. Then, a translatory movement of a pin 82 effects a rotational movement of the holding device 1 about the axis defined by the cylindrical pin guided in the opening in the base plate 56. The pin 82 engages between the three teeth of the turning tooth system (67, 68).

The turning pin 82, which engages in the turning tooth system 68, can be a component of a wagon 81 as shown, for example, in FIGS. 11 and 14. If the wagon 81 is moved from the right to the left as shown in the drawing, then the holding device 1 executes a turning movement of 180° about the rotational axis explained above. The sides of the lens thereby transpose their position. It is also possible to arrange or configure the turning tooth system 68 and the turning pin 82 in such a manner that a rotational movement of more than 180° or less than 180° takes place.

The surface of the base plate 56 and/or a side surface of a holding arm (59, 60) functions as an inscription surface for applying a matrix code for the work flow or process parameter control. All surfaces are inclined by at least 2° with respect to the lower contact/support surface 71 in order to always ensure a runoff of liquid after carrying out a dip process or washing process. In connection herewith, sharp edges are provided which prevent fluid from collecting.

FIGS. 15 to 18 show a seventh embodiment of a holding device 1 according to the invention having two arms (59, 60) and a turning arrangement (81, 82, 83, 84, 68) in different views. FIG. 15 shows the holding device 1 together with a turning arrangement in top plan view. FIG. 16 shows the holding device 1 in a perspective view and FIG. 17 in a side elevation view. FIG. 18 shows the wagon 81 of the turning arrangement (81, 82, 83, 84, 68) in a side elevation view.

The holding device 1 of FIGS. 15 to 17 is configured very similarly to the holding device 1 shown in FIGS. 11 to 13. Here too, the holding device 1 includes a base plate 56 having an outer peripheral turning tooth system (67, 68) as well as two holding arms (59, 60) having end heads (61, 62).

In this embodiment, the heads (61, 62) are not, however, configured in the form of outer jackets (78, 79); instead, the heads (61, 62) are made of a unitary bulk material. Polycarbonate was used here as a bulk material. This material has the required resistance with respect to the different atmospheres in lens finishing. Furthermore, this material ensures a transmitted light illumination for curing the adhesive connecting lens and holding device 1. For the sake of completeness, the region which is at least permeable for ultraviolet light is identified by reference numeral 85.

The base plate 56 has here no opening for accommodating a pin of a transport arrangement; instead, the base plate 56 itself carries a carrier cylinder 87 directed downwardly. The carrier cylinder 87 carries, at its end, a spherical head 88 whereby the carrier cylinder 87 can be inserted into an opening in a transport arrangement or the like. The carrying cylinder 87 includes a peripherally-extending guide slot 90 whereinto a latch projection or the like of the transport arrangement can be introduced and guided into engagement in order to align the carrier cylinder 87 in the axial direction with respect to the transport arrangement. The guide slot 90 includes a fixation bore 89 in order to fix the carrier cylinder 87 in the peripheral direction in a defined position (and therewith the entire holding device 1) by means of a corresponding counterelement assigned to the transport arrangement.

The insertable sphere 88 further has the purpose that the holder 1 can be placed on only two support tips. The insertable sphere 88 has a steel core. In this way, the holding device 1 can be held via a strong magnet in the vertical almost without contact (except for the tips). In a dip process, it is hereby avoided that the holder 1, because of a lacquer deposited during the dip process, becomes stuck in the transport frame of the transport arrangement.

It is understood that the foregoing description is that of the preferred embodiments of the invention and that various changes and modifications may be made thereto without departing from the spirit and scope of the invention as defined in the appended claims.

| | List of Reference Numerals |
|---|---|
| 1. | Holding device |
| 2. | First holding element |
| 3. | Second holding element |
| 4. | Adhesive element |
| 5. | Lens edge |
| 6. | Lens |
| 7. | Adhesive element |
| 8. | Flattened end region |
| 9. | Flattened end region |
| 10. | Lens surface |
| 11. | Flag |
| 12. | Code |
| 13. | Holding comb |
| 14. | Holding rider |
| 15. | Holding rider |
| 16. | Adhesive element |
| 17. | Adhesive element |
| 18. | Annular sector |
| 19. | Notch |
| 20. | Bore |
| 21. | Bore |
| 22. | Link chain |
| 23. | Link element |
| 24. | Link element |
| 25. | Link element |
| 26. | Link element |
| 27. | Adhesive element |
| 28. | Adhesive element |
| 29. | Adhesive element |
| 30. | Holding spring |
| 31. | Mid region |
| 32. | S-shaped region |
| 33. | S-shaped region |
| 34. | End piece |
| 35. | End piece |
| 36. | Adhesive element |
| 37. | Adhesive element |
| 38. | Slit |
| 39. | Slot |
| 40. | Slot |
| 41. | Spherically-shaped segment |
| 42. | Holes |
| 43. | Hole side wall |
| 44. | Holding cylinder |
| 45. | Holding cylinder |
| 46. | Adhesive element |
| 47. | Adhesive element |
| 48. | Bore |
| 49. | Bore |
| 50. | Bore |
| 51. | Transport arrangement |
| 52. | Grip rod |
| 53. | Grip rod |
| 54. | Bore |
| 55. | Bore |
| 56. | Base plate |
| 57. | Vertical web |
| 58. | Vertical web |
| 59. | Elastic holding arm |
| 60. | Elastic holding arm |
| 61. | Head |
| 62. | Head |
| 63. | Transmitted light cementing pin of polycarbonate |
| 64. | Transmitted light cementing pin of polycarbonate |
| 65. | Metering slot for adhesive |
| 66. | Metering slot for adhesive |
| 67. | Turning tooth system |
| 68. | Turning tooth system |

List of Reference Numerals

| | |
|---|---|
| 69. | Surface |
| 70. | Index bore |
| 71. | Contact/support surface |
| 72. | Bayonet guide |
| 73. | End position latch surface |
| 74. | Grip surface |
| 75. | Grip surface |
| 76. | Light conductor |
| 77. | Adhesive length |
| 78. | Outer jacket |
| 79. | Outer jacket |
| 80. | Inscription surface for identification signature |
| 81. | Wagon |
| 82. | Guide pin |
| 83. | Guide pin |
| 84. | Guide pin |
| 85. | Region of transparent material |
| 86. | Shading for transmitted light |
| 87. | Carrying cylinder |
| 88. | Insertion sphere having integrated steel core |
| 89. | Fixation bore |
| 90. | Guide slot |
| 91. | Sacrificial geometry |

What is claimed is:

1. A transport arrangement for holding and manipulating lenses during the application of a coating in a dip trough, the arrangement comprising:
   a plurality of holding devices for holding corresponding ones of said lenses;
   a dipping unit having a frame defining two grippers for receiving said holding devices thereon;
   said holding devices being arranged on said frame so as to cause each of said lenses to be disposed exclusively above and/or laterally of the holding device assigned thereto so as to prevent a dripping from the holding devices onto corresponding ones of said lenses after a dip operation; and,
   wherein each of said holding devices comprises a holding comb defining at least two receptacles; at least two holding riders pluggable into corresponding ones of said receptacles; adhesive elements for cementing corresponding ones of said riders to the edge of the lens; and, said holding riders have openings for accommodating corresponding ones of said grippers thereby mounting the holding device on said frame.

2. A transport arrangement for holding and manipulating lenses during the application of a coating in a dip trough, the arrangement comprising:
   a plurality of holding devices for holding corresponding ones of said lenses;
   a dipping unit having a frame defining two grippers for receiving said holding devices thereon;
   said holding devices being arranged on said frame so as to cause each of said lenses to be disposed exclusively above and/or laterally of the holding device assigned thereto so as to prevent a dripping from the holding devices onto corresponding ones of said lenses after a dip operation; and,
   wherein each of said holding devices comprises a holding comb having a plurality of notches formed therein; at least two holding riders pluggable into corresponding ones of two of said notches; and, adhesive elements cementing said two riders to the edge of the lens.

3. The transport arrangement of claim 2, wherein said holding comb has an arcuate surface facing toward the lens held thereon via said holding riders.

4. A transport arrangement for holding and manipulating lenses during the application of a coating in a dip trough, the arrangement comprising:
   a plurality of holding devices for holding corresponding ones of said lenses;
   a dipping unit having a frame defining two grippers for receiving said holding devices thereon;
   said holding devices being arranged on said frame so as to cause each of said lenses to be disposed exclusively above and/or laterally of the holding device assigned thereto;
   wherein each of said holding devices comprises a holding comb having a plurality of notches formed therein; at least two holding riders pluggable into corresponding ones of two of said notches; and, adhesive elements for cementing said two riders to the edge of the lens; and,
   wherein said holding riders have respective openings for accommodating corresponding ones of said grippers thereby mounting the holding devices on said frame.

5. A holding device for holding a lens at the edge thereof, the holding device comprising:
   a holding comb defining at least two receptacles;
   at least two holding riders pluggable into corresponding ones of said receptacles;
   adhesive elements for cementing corresponding ones of said holding riders to the edge of the lens; and,
   wherein said holding riders have openings for accommodating corresponding ones of grippers for mounting the holding device on a frame for dipping into a dip bath.

6. A transport arrangement for holding and manipulating lenses during the application of a coating in a dip trough, the arrangement comprising:
   a plurality of holding devices for fixedly holding respective ones of said lenses thereon;
   each of said holding devices having mounting receptacles formed therein;
   a dipping unit having a frame defining two grippers for engaging each of said holding devices at respective ones of said mounting receptacles for receiving said holding devices on said frame with the lens corresponding to and fixedly attached to each holding device;
   said holding devices being arranged on said frame so as to cause each of said lenses to be disposed above said two grippers so as to prevent a dripping from the holding devices onto corresponding ones of said lenses during a dip operation;
   each of said holding devices including an adhesive connecting element for cementing the lens at the edge thereof to the corresponding holding device; and, said adhesive connecting element being provided as only one adhesive point or as only two adhesive points spaced from each other.

7. The transport arrangement of claim 6, wherein each of said holding devices comprises a link chain having several links; said link chain has said mounting receptacles formed therein for accommodating corresponding ones of said grippers; and, said adhesive connecting element is assigned to at least one of the links of said link chain for cementing said at least one of said links to the edge of the lens.

8. The transport arrangement of claim 7, wherein each two mutually adjacent ones of said links are adjustable to conjointly define different angles to accommodate lenses of different geometric configuration.

9. The transport arrangement of claim 7, wherein the number of said chain links varies in dependence upon lens diameter.

10. The transport arrangement of claim 6, wherein said adhesive connecting points are only two in number separated from each other along the periphery of the lens corresponding thereto thereby providing increased lateral support therefor.

\* \* \* \* \*

UNITED STATES PATENT AND TRADEMARK OFFICE
CERTIFICATE OF CORRECTION

PATENT NO. : 9,956,575 B2  
APPLICATION NO. : 14/692232  
DATED : May 1, 2018  
INVENTOR(S) : R. Meschenmoser et al.

Page 1 of 1

It is certified that error appears in the above-identified patent and that said Letters Patent is hereby corrected as shown below:

On the Title Page

Under (56) Foreign Patent Documents:  
Delete "DE 235 924" and substitute -- DD 235 924 -- therefor.

Signed and Sealed this  
Tenth Day of July, 2018

Andrei Iancu  
*Director of the United States Patent and Trademark Office*